United States Patent
Schaepkens et al.

(10) Patent No.: US 8,633,574 B2
(45) Date of Patent: Jan. 21, 2014

(54) ORGANIC ELECTRONIC PACKAGES HAVING HERMETICALLY SEALED EDGES AND METHODS OF MANUFACTURING SUCH PACKAGES

(71) Applicant: General Electric Company, Schenectady, NY (US)

(72) Inventors: Marc Schaepkens, Clifton Park, NY (US); Anil R. Duggal, Niskayuna, NY (US); Christian Maria Anton Heller, Munich (DE)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 13/801,505

(22) Filed: Mar. 13, 2013

(65) Prior Publication Data
US 2013/0248828 A1 Sep. 26, 2013

Related U.S. Application Data

(62) Division of application No. 10/817,531, filed on Apr. 2, 2004, now Pat. No. 8,405,193.

(51) Int. Cl.
*H01L 23/58* (2006.01)

(52) U.S. Cl.
USPC ........ 257/642; 257/E51.022; 257/40; 438/82; 428/411.1

(58) Field of Classification Search
USPC .................. 257/E51.001, E51.012, E51.018, 257/E51.022, E25.008, 40, 94, 99, 100, 257/642; 438/82, 99, 725, 780; 428/411.1, 428/412, 421, 422, 422.8, 451, 473.5, 520
See application file for complete search history.

(56) References Cited

U.S. PATENT DOCUMENTS

| | | | |
|---|---|---|---|
| 6,080,031 A | 6/2000 | Rogers et al. | |
| 6,081,071 A * | 6/2000 | Rogers | 313/512 |
| 6,537,688 B2 | 3/2003 | Silvernail et al. | |
| 6,576,351 B2 * | 6/2003 | Silvernail | 428/690 |
| 6,624,568 B2 * | 9/2003 | Silvernail | 313/504 |
| 6,655,788 B1 * | 12/2003 | Freeman | 347/58 |
| 6,692,610 B2 * | 2/2004 | Low et al. | 156/273.5 |
| 6,704,133 B2 * | 3/2004 | Gates et al. | 359/296 |
| 6,737,753 B2 | 5/2004 | Kumar et al. | |
| 7,018,713 B2 * | 3/2006 | Padiyath et al. | 428/411.1 |
| 7,189,990 B2 * | 3/2007 | Kim et al. | 257/40 |
| 7,541,671 B2 * | 6/2009 | Foust et al. | 257/688 |
| 7,648,925 B2 * | 1/2010 | Moro et al. | 438/780 |
| 7,649,674 B2 * | 1/2010 | Danner et al. | 359/296 |
| 7,705,531 B2 * | 4/2010 | Furuie et al. | 313/506 |
| 7,816,676 B2 * | 10/2010 | Fourst et al. | 257/40 |
| 7,977,876 B2 * | 7/2011 | Yamazaki et al. | 313/512 |
| 8,030,844 B2 * | 10/2011 | Shin et al. | 313/511 |
| 8,093,512 B2 * | 1/2012 | Chen et al. | 174/523 |
| 2002/0068143 A1 * | 6/2002 | Silvernail et al. | 428/76 |
| 2003/0062527 A1 * | 4/2003 | Kumar et al. | 257/79 |
| 2003/0104753 A1 | 6/2003 | Graff et al. | |

FOREIGN PATENT DOCUMENTS

JP 05242966 9/1993

* cited by examiner

*Primary Examiner* — Chris Chu
(74) *Attorney, Agent, or Firm* — Mary Louise Stanford

(57) ABSTRACT

Organic electronic packages having sealed edges. More specifically, packages having organic electronic devices are provided. A number of sealing mechanisms are provided to hermetically seal the edges of the package to completely protect the organic electronic device from external elements. A sealant may be implemented to completely surround the organic electronic device. Alternatively, edge wraps may be provided to completely surround the organic electronic device.

27 Claims, 6 Drawing Sheets

ORGANIC ELECTRONIC PACKAGES HAVING HERMETICALLY SEALED EDGES AND METHODS OF MANUFACTURING SUCH PACKAGES

CROSS REFERENCE TO RELATED APPLICATIONS

This Application is a Divisional of U.S. patent application Ser. No. 10/817,531, which was filed on Apr. 2, 2004, now U.S. Pat. No. 8,405,193, which issued on Mar. 26, 2013.

BACKGROUND

A developing trend in circuit and display technology involves the implementation of organic electronic and optoelectronic devices, which provide low cost, high performance alternatives to silicon electronic devices. One such organic device is the organic light emitting diode (OLED). OLED's are solid-state semiconductor devices, which implement organic semiconductor layers to convert electrical energy into light. Generally, OLEDs are fabricated by disposing multiple layers of organic thin films between two conductors or electrodes. The electrode layers and the organic layers are generally disposed between two substrates, such as glass or plastic. The OLEDs operate by accepting charge carriers of opposite polarities, electrons and holes, from the electrodes. An externally applied voltage drives the charge carriers into the recombination region to produce light emissions. Unlike many silicon based devices, OLEDs can be processed using low cost, large area thin film deposition processes which allow for the fabrication of ultra-thin, light weight lighting displays. Significant developments have been made in providing general area lighting implementing OLEDs.

Conventional OLED devices may implement top and bottom glass substrates. Advantageously, glass substrates generally provide adequate hermeticity to seal the device from exposure to moisture and oxygen that is present in the atmosphere. Disadvantageously, glass substrates are thick, heavy and relatively fragile. Providing reliable electrical contacts to organic thin films is made more difficult when the devices are exposed to air and water, which can degrade their electronic properties rapidly.

Another example organic electronic device is an organic photovoltaic (OPV) device. OPVs are solid-state semiconductor devices that implement organic semiconductor layers to convert light into electrical energy. Disadvantageously, OPVs may also be susceptible to the degradation, durability and manufacturability issues discussed above with respect to the OLEDs.

To provide more durable and more easily manufacturable devices, the organic electronic devices may be fabricated on a flexible base material such as transparent, polymeric films or metal foils. Polymeric films coated with ultra-high barrier layers and metal foils generally provide hermetically acceptable materials on which to build the organic electronic devices and which may be implemented in roll-to-roll manufacturing processes. While the metal foils and the ultra-high barrier coated polymeric films generally provide sufficient protection from moisture and oxygen on the top and bottom surfaces of the organic electronic device, the edges of the device may still be susceptible to moisture and oxygen. This may be especially true in roll-to-roll manufacturing systems. Accordingly, there is continued need for organic electronic devices, which implement flexible substrates and do not suffer from permeation of environmental elements through the edges of the devices.

BRIEF DESCRIPTION

In accordance with one embodiment of the present techniques, there is provided a package comprising a flexible substrate comprising a polymeric transparent film; an organic electronic device coupled to the transparent film; a sealant coupled to the flexible substrate and disposed about the perimeter of the organic electronic device; and a superstrate coupled to the sealant and disposed proximate to the organic electronic device.

In accordance with another embodiment of the present techniques, there is provided a package comprising: a flexible substrate comprising a polymeric transparent film; an organic electronic device coupled to the transparent film; a sealant coupled to the transparent film and disposed about the perimeter of the organic electronic device; and a superstrate coupled to the sealant and disposed proximate to the organic electronic device, wherein the superstrate comprises a periphery adapted to wrap around edges of the package such that the periphery of the superstrate is coupled to a side of the flexible substrate opposite the organic electronic device.

In accordance with yet another embodiment of the present techniques, there is provided a package comprising: a flexible substrate comprising a polymeric transparent film; an organic electronic device coupled to the transparent film; a sealant coupled to the transparent film and disposed about the perimeter of the organic electronic device; a superstrate coupled to the sealant and disposed proximate the organic electronic device; and an edge seal coupled to each of the flexible substrate and the superstrate and configured to hermetically seal peripheral edges of the package.

In accordance with still another embodiment of the present techniques, there is provided a package comprising: a first composite substrate, wherein peripheral edges of the first composite substrate are covered with a first edge seal; a second composite substrate, wherein peripheral edges of the second composite substrate are covered with a second edge seal; and an organic electronic device disposed between the first composite substrate and the second composite substrate, wherein the first composite substrate is coupled to the second composite substrate via a sealant.

In accordance with a further embodiment of the present techniques, there is provided a method of fabricating a package comprising: providing a roll of a flexible substrate film; disposing a plurality of organic devices on the flexible substrate film; providing a roll of metal foil, the roll of metal foil having approximately the same dimensions as the roll of flexible substrate film; disposing a sealant on the metal foil such that the sealant is arranged to form a plurality of perimeters, wherein each of the plurality of perimeters is sized to completely surround the organic devices once the metal foil is coupled to the flexible substrate film; and coupling the metal foil to the flexible substrate film.

DRAWINGS

Advantages and features of the invention may become apparent upon reading the following detailed description and upon reference to the drawings in which.

DETAILED DESCRIPTION

Figure 1:
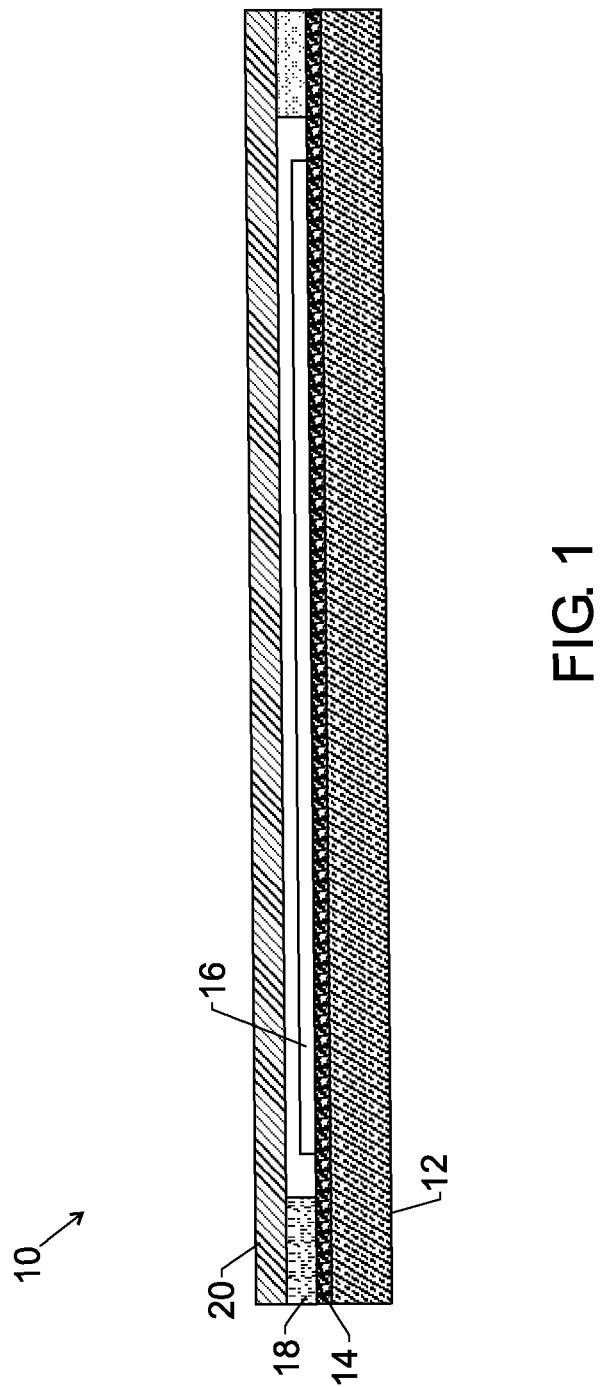
FIG. 1 illustrates a cross-sectional view of one embodiment of an organic electronic package in accordance with the present techniques.

FIG. 1 illustrates an organic package having a flexible substrate 12. The flexible substrate 12 generally comprises a substantially transparent film. As used herein, "substantially transparent" refers to a material allowing a total transmission of at least about 50%, preferably at least about 80%, of visible light (i.e., having a wave length in the range from about 400 nm to about 700 nm). The flexible substrate 12 is generally thin, having a thickness in the range of approximately 0.25-50.0 mils, and preferably in the range of approximately 0.5-10.0 mils. The term "flexible" generally means being capable of being bent into a shape having a radius of curvature of less than approximately 100 cm.

The flexible substrate 12 may be dispensed from a roll, for example. Advantageously, implementing a roll of transparent film for the flexible substrate 12 enables the use of high-volume, low cost, reel-to-reel processing and fabrication of the organic package 10. The roll of transparent film may have a width of 1 foot, for example, on which a number of organic packages may be fabricated and excised. The flexible substrate 12 may comprise a single layer or may comprise a structure having a plurality of adjacent layers of different materials. The flexible substrate 12 has an index of refraction in the range of approximately 1.05-2.5, and preferably in the range of approximately 1.1-1.6. Further, the flexible substrate 12 generally comprises any flexibly suitable polymeric material. For instance, the flexible substrate 12 may comprise polycarbonates, polyarylates, polyetherimides, polyethersulfones, polyimides, such as Kapton H or Kapton E (made by Dupont) or Upilex (made by UBE Industries, Ltd.), polynorbornenes, such as cyclic-olefins (COC), liquid crystal polymers (LCP), such as polyetheretherketone (PEEK), polyethylene terephthalate (PET), and polyethylene naphtalate (PEN).

To provide hermeticity, the flexible substrate 12 is coated with a transparent bather coating 14 to prevent moisture and oxygen diffusion through the flexible substrate 12. The barrier coating 14 may be disposed or otherwise formed on the surface of the flexible substrate 12 such that the barrier coating 14 completely covers the flexible substrate 12. The barrier coating 14 may comprise any suitable reaction or recombination products for reacting species. The barrier coating 14 may be disposed at a thickness in the range of approximately 10 nm to about 10,000 nm, and preferably in the range of approximately 10 nm to about 1,000 nm. It is generally desirable to choose a coating thickness that does not impede the transmission of light through the flexible substrate 12, such as a barrier coating 14 that causes a reduction in light transmission of less than about 20%, and preferably less than about 5%. It is also desirable to choose a coating material and thickness that does not significantly reduce the substrate's flexibility, and whose properties do not significantly degrade with bending. The coating may be disposed by any suitable deposition techniques, such as plasma-enhanced chemical-vapor deposition (PECVD), radio-frequency plasma-enhanced chemical-vapor deposition (RFPECVD), expanding thermal-plasma chemical-vapor deposition (ETPCVD), reactive sputtering, electron-cyclodrawn-residence plasma-enhanced chemical-vapor deposition (ECRPECVD), inductively coupled plasma-enhanced chemical-vapor deposition (ICPECVD), sputter deposition, evaporation, atomic layer deposition (ALD), or combinations thereof.

The barrier coating 14 may comprise organic, inorganic or ceramic materials, for instance. The materials are reaction or recombination products of reacting plasma species and are deposited onto the surface of the flexible substrate 12. Organic coating materials may comprise carbon, hydrogen, oxygen and optionally, other minor elements, such as sulfur, nitrogen, silicon, etc., depending on the types of reactants. Suitable reactants that result inorganic compositions in the coating are straight or branched alkanes, alkenes, alkynes, alcohols, aldehydes, ethers, alkylene oxides, aromatics, etc., having up to 15 carbon atoms. Inorganic and ceramic coating materials typically comprise oxide, nitride, carbide, boride, or combinations thereof of elements of Groups IIA, IIIA, IVA, VA, VIA, VIIA, IB, and IIB; metals of Groups IIIB, IVB, and VB, and rare-earth metals. For example, silicon carbide can be deposited onto a substrate by recombination of plasmas generated from silane ($SiH_4$) and an organic material, such as methane or xylene. Silicon oxycarbide can be deposited from plasmas generated from silane, methane, and oxygen or silane and propylene oxide. Silicon oxycarbide also can be deposited from plasmas generated from organosilicone precursors, such as tetraethoxysilane (TEOS), hexamethyldisiloxane (HMDSO), hexamethyldisilazane (HMDSN), or octamethylcyclotetrasiloxane (D4). Silicon nitride can be deposited from plasmas generated from silane and ammonia. Aluminum oxycarbonitride can be deposited from a plasma generated from a mixture of aluminum titrate and ammonia. Other combinations of reactants, such as metal oxides, metal nitrides, metal oxynitrides, silicon oxide, silicon nitride, silicon oxynitrides may be chosen to obtain a desired coating composition.

Further, the bather coating 14 may comprise hybrid organic/inorganic materials or multilayer organic/inorganic materials. The inorganic materials may be chosen from A-F elements and the organic materials may comprise acrylates, epoxies, epoxyamines, xylenes, siloxanes, silicones, etc. The choice of the particular reactants can be appreciated by those skilled in the art. Most metals may also be suitable for the barrier coating 14 in applications where transparency of the flexible substrate 12 is not required. As can be appreciated, the flexible substrate 12 may comprise a composition, which incorporates the barrier coating 14 to provide a hermetic substrate.

The organic package 10 also includes an organic electronic device 16 coupled to the barrier coating 14. The organic electronic device 16 may comprise an OLED or OPV, for instance. The organic electronic device 16 generally includes a number of organic semiconductor layers disposed between two conductors or electrodes. Accordingly, while not illustrated in FIG. 1, the electrodes of the organic electronic device 16 are electrically coupled to an external current source, which is used to initiate the light producing reactions in the organic electronic device 16.

To provide hermeticity about the perimeter of the organic electronic device 16, a sealant 18 is coupled to the barrier coating 14. The sealant 18 is disposed about the entire perimeter of the organic electronic device 16 such that the organic electronic device 16 is completely surrounded by the sealant 18. Techniques for disposing the sealant 18 will be described further herein with reference to FIG. 2. The sealant 18 preferably comprises an adhesive material such that it may be implemented to couple the flexible substrate 12 (and barrier coating 14) to the superstrate 20, thereby completely enclosing the organic electronic device. Accordingly, the sealant 18 may comprise epoxies, acrylates, Norland 68 UV curables, thermally curable adhesives, pressure sensitive adhesives, such as thermosets and thermo-plasts or room temperature vulcanized (RTV) adhesives, for instance. The sealant 18 generally comprises any material having a low permeability and providing adhesion.

Finally, the organic package 10 includes a superstrate 20 which may be coupled to the flexible substrate 12 by the sealant 18. As used herein, "superstrate" simply refers to the upper substrate of the organic package 10. Accordingly, the term "superstrate" may be used interchangeably with "second substrate," "upper substrate," "top substrate," or the like. To provide hermeticity, and flexibility, the superstrate 20 generally comprises a thin material having a low permeability. The superstrate 20 may or may not be transparent, depending on the application. In one embodiment, the superstrate 20 comprises a reflective material, such as a metal foil, to reflect light produced by the organic electronic device 16. The superstrate 20 may comprise aluminum foil, stainless steel foil, copper foil, tin, Kovar, Invar, etc. In applications where reflective light is less critical, the superstrate 20 may comprise thin glass, sapphire, mica or barrier coated plastics having a low permeability.

The reflective superstrate 20 may be implemented to reflect any radiation emitted away from the substantially transparent flexible substrate 12 and direct such radiation toward the flexible substrate 12 such that the total amount of radiation emitted in this direction is increased. Advantageously, the superstrate 20 may comprise a material to prevent diffusion of reactive environmental elements, such as oxygen and water, into the organic electronic device 16. The superstrate 20 is sufficiently thin so as not to reduce the flexibility of the entire device. Further, the superstrate 20 may include a number of layers of various metals or metal compound to further reduce the diffusion of oxygen and water vapor into the organic electronic device 16. In one embodiment, the inner layer of the superstrate 20, directly adjacent to the organic electronic device 16, is reflective while the outer layers comprise non-reflective materials or compounds such as metal oxides, nitrides, carbides, oxynitrides, or oxycarbides which may be implemented to reduce the rate of diffusion of oxygen and water into the organic electronic device 16.

Figure 2:
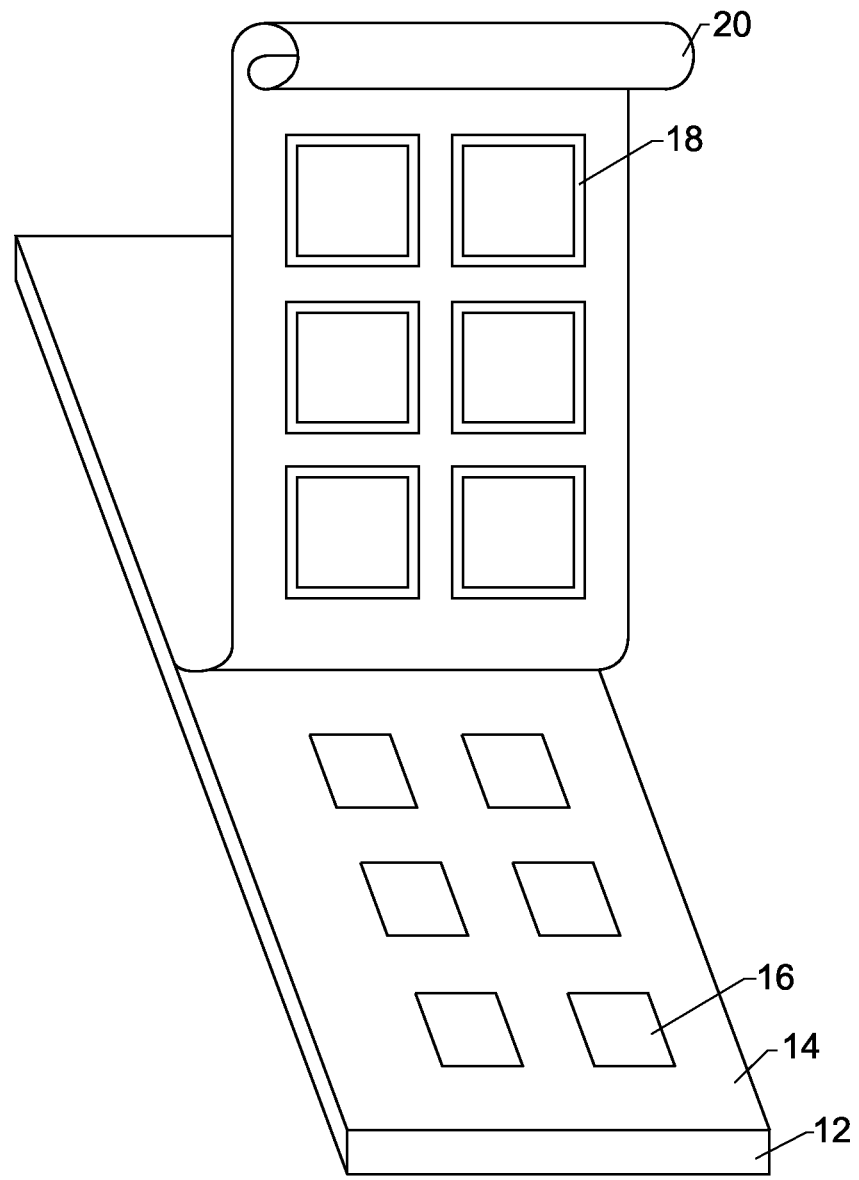
FIG. 2 illustrates a perspective view of one method of fabricating an organic electronic package in accordance with the present techniques.

FIG. 2 illustrates an exemplary technique for fabricating a number of organic packages, such as the organic package 10 discussed with reference to FIG. 1. As will be appreciated, the flexible substrate 12 may be fed from a polymer film roll. In one exemplary embodiment, the roll may be sized such that two organic packages 10 can be fabricated adjacent to one another, as illustrated in FIG. 2. The flexible substrate 12 is coated with the barrier coating 14 and organic electronic devices 16 may be arranged thereon. The superstrate 20 may also be fed from a roll. In the present exemplary embodiment, the sealant 18 is disposed onto the surface of the superstrate 20 to form the seal around the entire periphery of the organic electronic device, once the superstrate 20 is coupled to the flexible substrate 12. The sealant 18 may be screen printed, inkjet printed, lamintated or disposed onto the surface of the superstrate 20 by any other suitable means. As illustrated in FIG. 2, the sealant 18 is arranged such that it will surround the organic electronic device 16 once the rolled superstrate 20 is coupled to the substrate 12. Once roll-to-roll manufacturing is completed, the organic devices 10 may be excised from the rolls. As will be appreciated, other fabrication techniques may be implemented to construct the organic devices 10.

Figure 3:
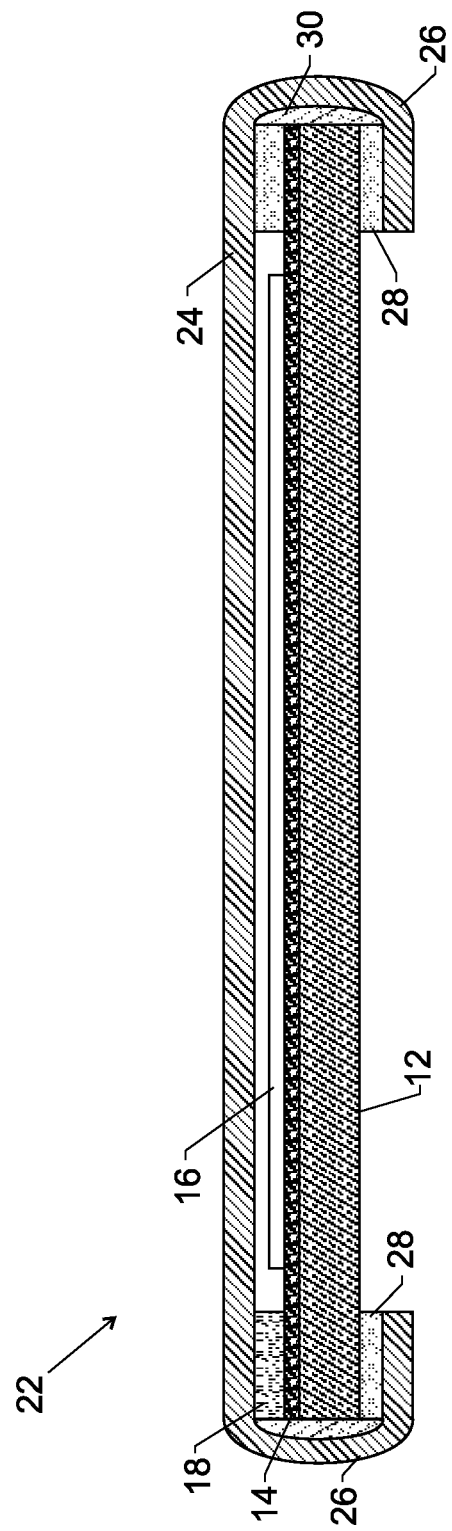
FIG. 3 illustrates a cross-sectional view of another embodiment of an organic electronic package in accordance with the present techniques.

FIG. 3 illustrates an alternate embodiment of an organic package 22 having hermetically sealed edges. As with the embodiment illustrated in FIG. 1, the organic package 22 includes a flexible substrate 12, a barrier coating 14, an organic electronic device 16 and a sealant 18 disposed about the periphery of the organic electronic device 16. The organic package 22 includes a superstrate 24 having a periphery adapted to wrap around the edges of the organic package 22. That is to say, the superstrate 24 is larger than the flexible substrate 12. As used herein, "adapted to," "configured to," and the like refer to elements that are sized, arranged or manufactured to form a specified structure or to achieve a specified result. The superstrate 24 may comprise aluminum foil, stainless steel foil, copper foil, tin, Kovar, Invar, etc. The superstrate 24 may be insulative or conductive. If the superstrate 24 is conductive, the organic package 22 may be configured such that the superstrate 24 may provide a bus-bar contact to the organic electronic device 16.

The superstrate 24 includes edges 26 which are sized such that they can be wrapped around the edges of the flexible substrate 12 and coupled to the frontside of the flexible substrate 12 (i.e., the side of the flexible substrate 12 that is opposite to the side having the organic electronic device 16 attached thereto). The edges 26 of the superstrate 24 may be adhesively coupled to the frontside of the flexible substrate 12 using a sealant 28. The sealant 28 may comprise the same material as the sealant 18. Alternatively, the sealant 28 may comprise a different material than the sealant 18. As can be appreciated, to effectively protect the organic electronic device 16 from moisture and oxygen, the sealant 28 advantageously comprises a material having a low permeability.

The organic package 22 may be fabricated similarly to the process described with reference to FIG. 2. Roll-to-roll techniques may be implemented during initial fabrication of the organic package 22. The only difference in the processing is that enough spacing between the printed sealant 18 should be provided such that the superstrate 20 can be molded around the edges of the organic electronic device 16 and around the edges and attached to the frontside of the flexible substrate 12 once the organic devices 16 have been excised from the roll.

To further provide hermeticity to the organic package 22, a desiccant or getter material may be disposed within the pockets created by wrapping the edges 26 of the superstrate 24. As can be appreciated, the desiccant comprises a material having a high affinity for water or oxygen and is implemented as a drying agent. The desiccant or getter 30 advantageously absorbs moisture or oxygen thereby further protecting the organic electronic device 16. The desiccant or getter 30 may comprise calcium oxide, silica gel, Hisil, Zeolite, calcium sulfate (DRIERITE), barium oxide, or other reactive metals for instance. As can be appreciated, the desiccant or getter 30 may be omitted.

Figure 4:
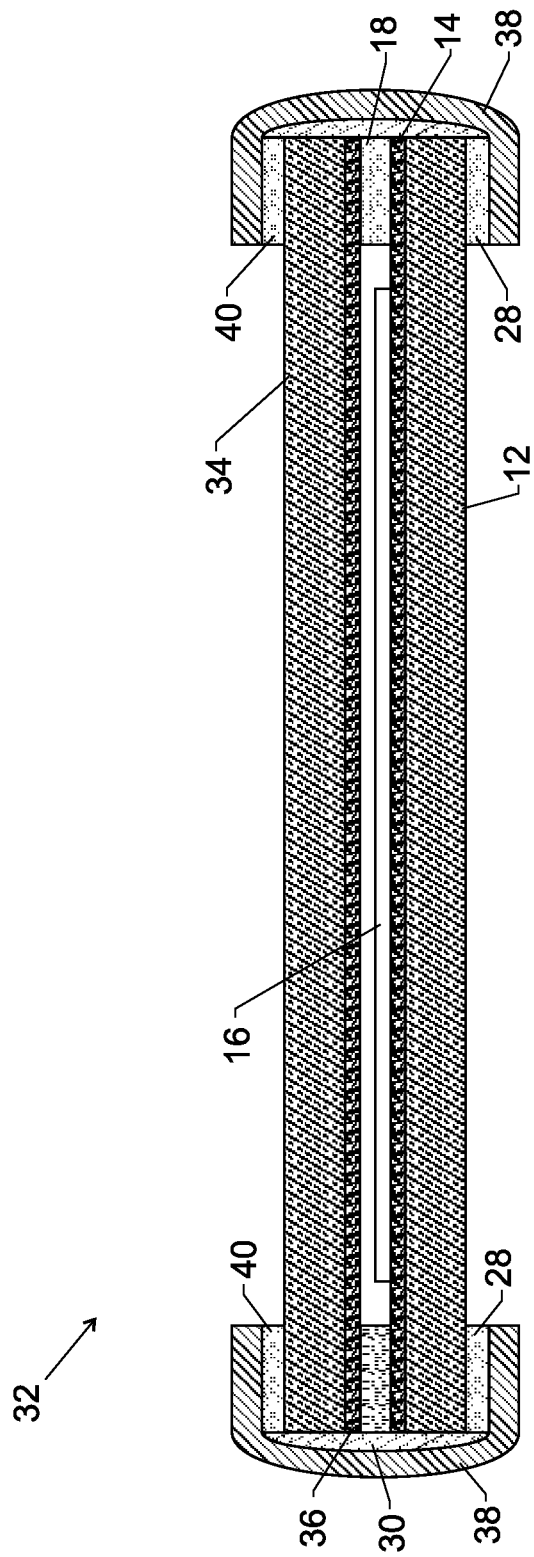
FIG. 4 illustrates a cross-sectional view of yet another embodiment of an organic electronic package in accordance with the present techniques.

FIG. 4 illustrates another alternate embodiment of an organic package 32 having hermetically sealed edges. As with the embodiment illustrated in FIGS. 1 and 3, the organic package 32 includes a flexible substrate 12, a barrier coating 14, an organic electronic device 16 and a sealant 18 disposed about the periphery of the organic electronic device 16. In the present exemplary embodiment, rather than implementing a reflective superstrate, a second flexible substrate 34, similar to the first flexible substrate and having a barrier coating 36 thereon may be disposed on the sealant 18. Once the second flexible substrate 34 is coupled to the first flexible substrate 12, the edges may be sealed by implementing flexible edge seals 38 to provide improved hermeticity. The edge seals 38 may comprise aluminum foil, stainless steel foil, copper foil, tin, Kovar, Invar, etc. and may be insulative or conductive. The flexible edge seals 38 are coupled to the substrate 12 via a sealant 28 and coupled to the substrate 34 via a sealant 40. The flexible edge seals 38 may provide a more robust organic package since cracks in the hermetic coating of a flexible superstrate, for instance, are eliminated. As with the exemplary embodiment described with reference to FIG. 3, a desiccant or getter material 30 may be disposed within the pockets created by wrapping the edge seals 38 around the edges of the organic package 32.

Figure 6:
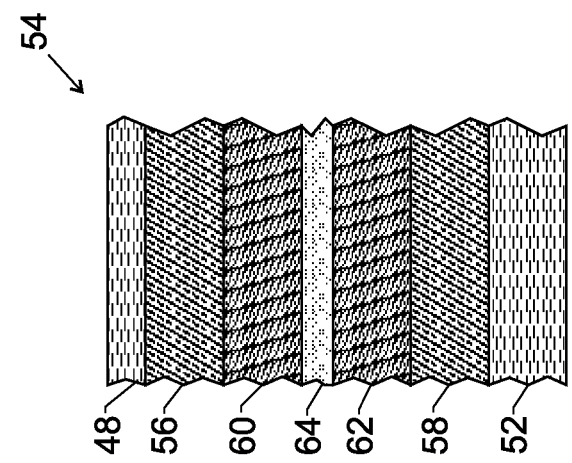
FIG. 6 illustrates a cross-sectional view of another exemplary composite substrate that may be implemented in conjunction with the present techniques.

FIGS. 1-4 provide a description of a flexible substrate having an organic device fabricated thereon and configured to provide improved hermeticity. As described above, the flexible substrate 12 described above with reference to FIGS. 1-4 may comprise a composite of materials. Two exemplary composite substrates are illustrated and briefly described with reference to FIGS. 5 and 6. As will be appreciated, the layers described with reference to FIGS. 5 and 6 are best understood with reference to the description provided above with reference to FIG. 1.

Figure 5:
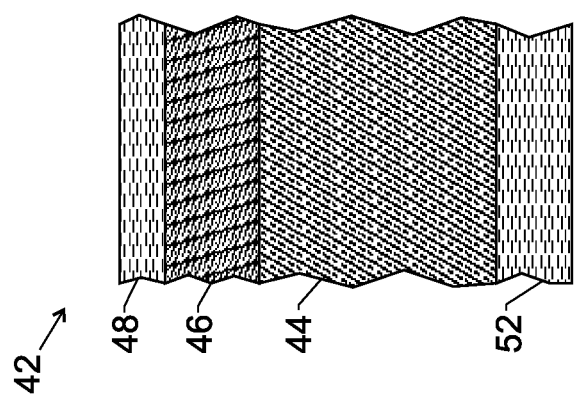
FIG. 5 illustrates a cross-sectional view of an exemplary composite substrate that may be implemented in conjunction with the present techniques.

FIG. 5 illustrates a flexible substrate 42 having a composite structure. The substrate 42 includes a substantially transparent flexible film 44 having a thickness in the range of approximately 0.25-50.0 mils, and preferably in the range of approximately 0.5-10.0 mils The film 44 may be dispensed from a roll, for example. The film has an index of refraction in the range of approximately 1.05-2.5, and preferably in the range of approximately 1.1-1.6. Further, the film 44 generally comprises any flexibly suitable polymeric material. For instance, the film 44 may comprise polycarbonates, polyarylates, polyetherimides, polyethersulfones, polyimides, such as Kapton H or Kapton E (made by Dupont) or Upilex (made by UBE Industries, Ltd.), polynorbornenes, such as cyclic-olefins (COC), liquid crystal polymers (LCP), such as polyetheretherketone (PEEK), polyethylene terephthalate (PET), and polyethylene naphtalate (PEN).

To provide hermeticity, the film 44 is coated with a transparent barrier coating 46 to prevent moisture and oxygen diffusion through the film 44 and to an organic electronic device (not shown). The bather coating 46 may be disposed or otherwise formed on the surface of the film 44. The barrier coating 46 may comprise any suitable reaction or recombination products for reacting species. The barrier coating 46 may be disposed at a thickness in the range of approximately 10 nm to about 10,000 nm, and preferably in the range of approximately 10 nm to about 1,000 nm. It is generally desirable to choose a coating thickness that does not impede the transmission of light through the film 44, such as a barrier coating 46 that causes a reduction in light transmission of less than about 20%, and preferably less than about 5%. The coating may be disposed by any suitable deposition techniques, such as plasma-enhanced chemical-vapor deposition (PECVD), for example.

As described in FIG. 1 with reference to the barrier coating 14, the barrier coating 46 may comprise organic, inorganic or ceramic materials, for instance. The materials are reaction or recombination products of reacting plasma species and are deposited onto the surface of the film 44. Organic coating materials may comprise carbon, hydrogen, oxygen and optionally, other minor elements, such as sulfur, nitrogen, silicon, etc., depending on the types of reactants. Suitable reactants that result inorganic compositions in the coating are straight or branched alkanes, alkenes, alkynes, alcohols, aldehydes, ethers, alkylene oxides, aromatics, etc., having up to 15 carbon atoms. Inorganic and ceramic coating materials typically comprise oxide, nitride, carbide, boride, or combinations thereof of elements of Groups IIA, IIIA, IVA, VA, VIA, VIIA, IB, and IIB; metals of Groups IIIB, IVB, and VB, and rare-earth metals. For example, silicon carbide can be deposited onto a substrate by recombination of plasmas generated from silane ($SiH_4$) and an organic material, such as methane or xylene. Silicon oxycarbide can be deposited from plasmas generated from silane, methane, and oxygen or silane and propylene oxide. Silicon oxycarbide also can be deposited from plasmas generated from organosilicone precursors, such as tetraethoxysilane (TEOS), hexamethyldisiloxane (HMDSO), hexamethyldisilazane (HMDSN), or octamethylcyclotetrasiloxane (D4). Silicon nitride can be deposited from plasmas generated from silane and ammonia. Aluminum oxycarbonitride can be deposited from a plasma generated from a mixture of aluminum titrate and ammonia. Other combinations of reactants, such as metal oxides, metal nitrides, metal oxynitrides, silicon oxide, silicon nitride, silicon oxynitrides may be chosen to obtain a desired coating composition.

Further, the barrier coating 46 may comprise hybrid organic/inorganic materials or multilayer organic/inorganic materials. The inorganic materials may be chosen from A-F elements and the organic materials may comprise acrylates, epoxies, epoxyamines, xylenes, siloxanes, silicones, etc. The choice of the particular reactants can be appreciated by those skilled in the art.

The substrate 42 may also comprise a coating or protective layer 48 that is chemically resistant and has a low coefficient of thermal expansion ("CTE"). The protective layer 48 may be implemented to advantageously prevent the underlying materials from being chemically attacked by chemicals commonly used during fabrication of the substrate 42 or the organic package. Further, because of the low CTE, the protective layer 48 also allows processing of the substrate 42 at high temperatures. The protective layer 48 may comprise acrylates, epoxies, epoxyamines, xylenes, siloxanes, silicones, etc. potentially filled with inorganic fillers such a silica particles, for instance and may be deposited by a roll coating, slot coating, bar coating, spincoating, and other known wet chemical coating techniques. Alternatively the protective layer 48 may comprise inorganic and ceramic coating materials which typically comprise oxide, nitride, carbide, boride, or combinations thereof of elements from Groups IIA, IIIA, IVA, VA, VIA, VIIA, IB, and IIB, or metals from Groups IIIB, IVB, and VB, and rare-earth metals, which can be deposited with deposition techniques, such as plasma-enhanced chemical-vapor deposition (PECVD), radio-frequency plasma-enhanced chemical-vapor deposition (RFPECVD), expanding thermal-plasma chemical-vapor deposition (ETPCVD), reactive sputtering, electron-cyclodrawn-residence plasma-enhanced chemical-vapor deposition (ECRPECVD), inductively coupled plasma-enhanced chemical-vapor deposition (ICPECVD), sputter deposition, evaporation, atomic layer deposition (ALD), or combinations thereof.

The outer surface of the composite substrate 42 may include also include a protective layer 52. The protective layer 52 generally comprises a layer/coating that is abrasion resistant and has a low coefficient of thermal expansion. The layer 52 may be implemented to prevent the substrate 42 from being scratched when handling. Further, because of the low CTE, the protective layer 52 also allows processing of the substrate 42 at high temperatures. The protective layer 52 may comprise any of those materials described above with respect to layer 48 and may be deposited by any of the deposition techniques described above with regard thereto.

FIG. 6 illustrates yet another embodiment of a flexible substrate 54 which may be implemented in accordance with the previously described sealing techniques. The composite substrate 54 illustrated in FIG. 6 is similar to the substrate illustrated with respect to FIG. 5. The difference between the substrate 54 and the substrate 42 is the use of two layers of film 56 and 58 (as opposed to one layer of film 44, as in FIG. 5) and two layers of barrier coating 60 and 62 (as opposed to one bather coating layer 46, as in FIG. 5). The barrier coating 60 is coupled to the barrier coating 62 through an adhesive layer 64.

Figure 7:
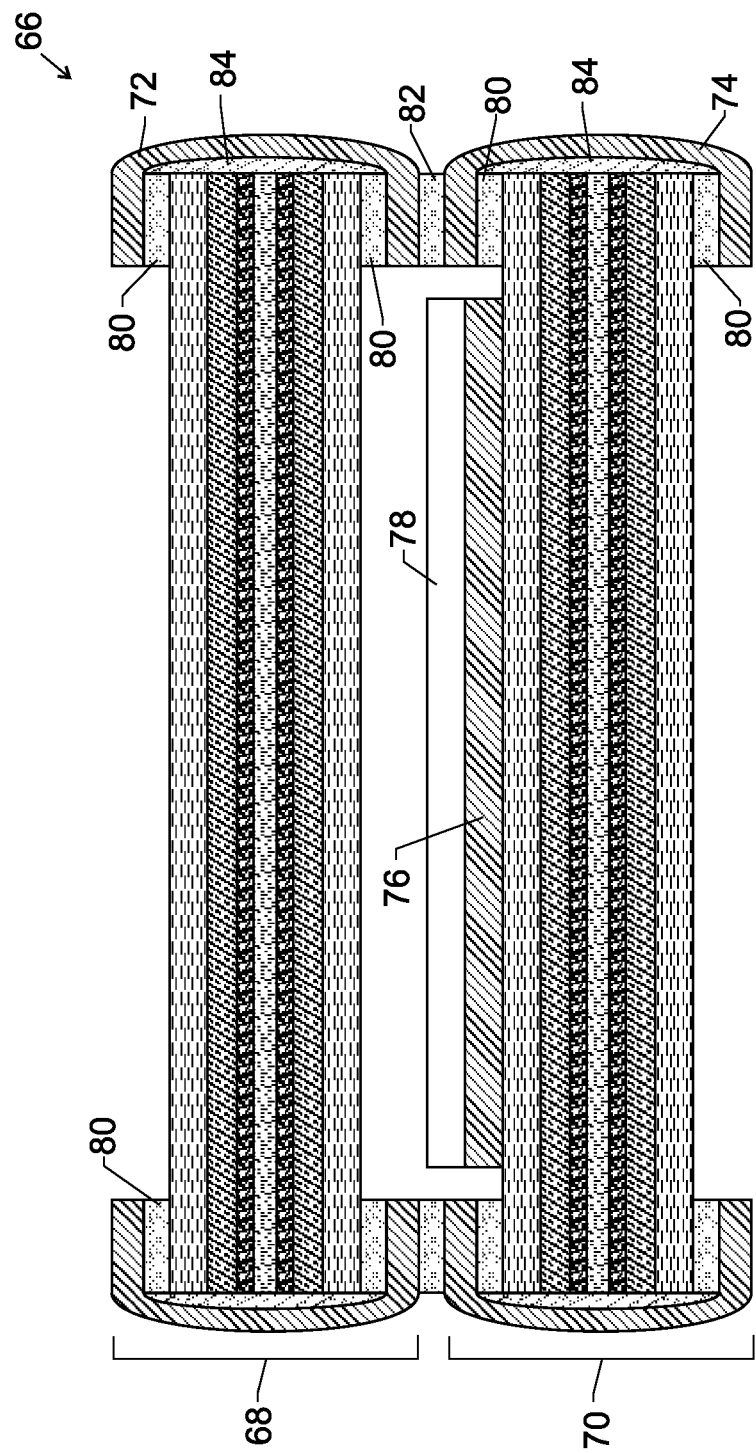
FIG. 7 illustrates a cross-sectional view of still another embodiment of an organic electronic package in accordance with the present techniques.

While the composite substrates 42 and 54 may be implemented to form any of the organic packages described above with reference to FIGS. 1-4, yet another embodiment, illustrated with reference to FIG. 7 may be implemented to provide an organic package. Referring now to FIG. 7, an organic package 66 is illustrated wherein the substrate described with reference to FIG. 6 is implemented. As will be appreciated, other substrate embodiments, such as the embodiment described with reference to FIG. 5, may also be used in conjunction with the edge sealing configuration illustrated in FIG. 7. As described further below, the embodiment illustrated in FIG. 7 implements a structure wherein the substrates are individually sealed.

The organic package 66 includes two composite substrates 68 and 70. Each composite substrate may have the structure described with reference to FIG. 6, for example. After fabrication of the substrates 68 and 70, the edges of each substrate 68 and 70 may be sealed by implementing respective flexible edge seals 72 and 74 to provide improved hermeticity. The edge seals 72 and 74 may comprise aluminum foil, stainless steel foil, copper foil, tin, Kovar, Invar, etc. and may be insulative or conductive. As will be appreciated, one of the substrates (here, the substrate 70) may include an anode layer 76 of the organic electronic device 78. The anode layer 76 may be deposited and patterned directly on the substrate 70. As will be appreciated, the anode layer 76 is implemented to inject positive charge carriers (or holes) into organic layers of the organic electronic device 78 and is made of a material having a high work function; e.g., greater than about 4.5 eV, preferably from about 5 eV to about 5.5 eV. For instance, indium tin oxide ("ITO") may be used to form the anode 76. ITO is substantially transparent to light transmission and allows at least 80% light transmitted therethrough. Therefore, light emitted from organic electroluminescent layers of the organic electronic device can easily escape through the ITO anode layer 76 without being seriously attenuated. Other materials suitable for use as the anode layer 76 are tin oxide, indium oxide, zinc oxide, indium zinc oxide, cadmium tin oxide, and mixtures thereof. In addition, materials used for the anode may be doped with aluminum or fluorine to improve charge injection property. The anode layer 76 may be deposited on the underlying structure by physical vapor deposition, chemical vapor deposition, ion beam-assisted deposition, or sputtering. A thin, substantially transparent layer of a metal is also suitable. Alternatively, the anode layer 76 may be part of the organic electronic device 78 which is latter coupled to the substrate 70.

The flexible edge seals 72 and 74 are coupled to the respective substrates 68 and 70 via a sealant 80. Once the edge seals 72 and 74 are attached to the substrates 68 and 70 and the organic electronic device 78 is attached to the substrate 68, the substrates 68 and 70 may be coupled together via an another sealant layer 82. Each of the sealants 80 and 82 may be disposed about the entire perimeter of the organic electronic device 78 such that the organic electronic device 78 is completely surrounded by the sealants 80 and 82, as previously described with reference to FIGS. 1 and 2. The sealants 80 and 82 preferably comprise an adhesive material such that the sealant 80 may be implemented to couple the flexible edge seals 72 and 74 to the respective substrates 68 and 70 and the sealant 82 may be implemented to couple the substrates 68 and 70 to one another. Accordingly, the sealants 80 and 82 may comprise epoxies, acrylates, Norland 68 UV curables, thermally curable adhesives, pressure sensitive adhesives, such as thermosets and thermo-plasts or room temperature vulcanized (RTV) adhesives, for instance. Alternatively, the edge seals may be soldered or welded together, whereby the solder or weld reaction product will act as the sealant 82. The sealants 80 and 82 generally comprise any material having a low permeability and providing adhesion. As previously described, a desiccant or getter material 84 may be disposed within the pockets created by wrapping the edge seals 72 and 74 around the edges of the substrates 68 and 70.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

The invention claimed is:

1. A package comprising:
    a first substrate comprising a flexible substrate comprising a polymeric transparent film;
    an organic electronic device coupled to the transparent film;
    a sealant coupled to the transparent film and disposed about the perimeter of the organic electronic device;
    a second substrate comprising a superstrate coupled to the sealant and disposed proximate the organic electronic device; and
    an edge seal coupled to each of the flexible substrate and the superstrate and configured to hermetically seal peripheral edges of the package.

2. The package, as set forth in claim 1, wherein the flexible substrate comprises the bather coating.

3. The package, as set forth in claim 1, wherein the flexible substrate is a composite substrate comprising:
    a first protective layer configured to resist abrasion;
    a polymeric transparent film coupled to the first protective layer;
    a barrier coating coupled to the transparent film; and
    a second protective layer coupled to the barrier coating and configured to protect the transparent film from chemical attach during fabrication.

4. The package, as set forth in claim 1, wherein the flexible substrate is a composite substrate comprising:
    a first protective layer configured to resist abrasion;
    a first polymeric transparent film coupled to the first protective layer;
    a first bather coating coupled to the first transparent film;
    a second barrier coating coupled to the first barrier coating via an adhesive layer;

a second polymeric transparent film coupled to the second barrier coating; and a second protective layer coupled to the barrier coating and configured to protect the transparent film from chemical attach during fabrication.

5. The package, as set forth in claim 1, comprising a barrier coating coupled between the flexible substrate and the organic electronic device.

6. The package, as set forth in claim 1, wherein the organic electronic device comprises an organic light emitting diode.

7. The package, as set forth in claim 1, wherein the organic electronic device comprises an organic photovoltaic device.

8. The package, as set forth in claim 1, wherein the sealant comprises an adhesive material having a low permeability.

9. The package, as set forth in claim 1, wherein the sealant comprises a thickness that is greater than a thickness of the organic electronic device.

10. The package, as set forth in claim 1, wherein the superstrate comprises a metal foil.

11. The package, as set forth in claim 1, comprising a desiccant material disposed within pockets formed by the edge seal.

12. The package, as set forth in claim 1, wherein the edge seal comprises a metal foil.

13. A package comprising:
a first substrate, wherein peripheral edges of the first substrate are covered with a first edge seal configured to hermetically seal peripheral edges of the first substrate;
an organic electronic device disposed on the first substrate; and
a second substrate disposed proximate to the orgainic electronic device and coupled to the first substrate via a sealant.

14. The package, as set forth in claim 13, wherein the peripheral edges of the second substrate are covered with a second edge seal configured to hermetically seal peripheral edges of the second substrate.

15. The package, as set forth in claim 13, wherein each of the first substrate and the second substrate comprises a composite substrate.

16. The package, as set forth in claim 13, wherein the first substrate is a composite substrate comprising:
a first protective layer configured to resist abrasion;
a polymeric transparent film coupled to the first protective layer;
a barrier coating coupled to the transparent film; and
a second protective layer coupled to the barrier coating and configured to protect the transparent film from chemical attach during fabrication.

17. The package, as set forth in claim 13, wherein the first substrate is a composite substrate comprising:
a first protective layer configured to resist abrasion;
a first polymeric transparent film coupled to the first protective layer;
a first barrier coating coupled to the first transparent film;
a second barrier coating coupled to the first barrier coating via an adhesive layer;
a second polymeric transparent film coupled to the second bather coating; and a second protective layer coupled to the barrier coating and configured to protect the transparent film from chemical attach during fabrication.

18. The package, as set forth in claim 13, wherein the sealant comprises an adhesive material having a low permeability.

19. The package, as set forth in claim 13, wherein the first edge seal comprises a metal foil.

20. A package comprising:
a first composite substrate, wherein peripheral edges of the first composite substrate are covered with a first edge seal;
a second composite substrate, wherein peripheral edges of the second composite substrate are covered with a second edge seal; and
an organic electronic device disposed between the first composite substrate and the second composite substrate, wherein the first composite substrate is coupled to the second composite substrate via a sealant.

21. The package, as set forth in claim 20, wherein each of the first composite substrate and the second composite substrate comprises:
a first protective layer configured to resist abrasion;
a polymeric transparent film coupled to the first protective layer;
a barrier coating coupled to the transparent film; and
a second protective layer coupled to the barrier coating and configured to protect the transparent film from chemical attach during fabrication.

22. The package, as set forth in claim 20, wherein each of the first composite substrate and the second composite substrate comprises:
a first protective layer configured to resist abrasion;
a first polymeric transparent film coupled to the first protective layer;
a first barrier coating coupled to the first transparent film;
a second barrier coating coupled to the first barrier coating via an adhesive layer;
a second polymeric transparent film coupled to the second barrier coating; and
a second protective layer coupled to the barrier coating and configured to protect the transparent film from chemical attach during fabrication.

23. The package, as set forth in claim 20, wherein the organic electronic device comprises an organic light emitting diode.

24. The package, as set forth in claim 20, wherein the organic electronic device comprises an organic photovoltaic device.

25. The package, as set forth in claim 20, wherein the sealant comprises an adhesive material having a low permeability.

26. The package, as set forth in claim 20, comprising a desiccant material disposed within pockets formed by each of the edge seals.

27. The package, as set forth in claim 20, wherein each of the edge seals comprises a metal foil.

* * * * *